United States Patent
Jia et al.

(10) Patent No.: US 10,385,445 B2
(45) Date of Patent: Aug. 20, 2019

(54) DETECTION DEVICE FOR DETECTING THICKNESS OF VACUUM-EVAPORATED FILM AND VACUUM EVAPORATION APPARATUS

(71) Applicant: BOE Technology Group Co., Ltd., Beijing (CN)

(72) Inventors: Wenbin Jia, Beijing (CN); Rui Peng, Beijing (CN); Xinxin Wang, Beijing (CN); Feifei Zhu, Beijing (CN); Xinwei Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 299 days.

(21) Appl. No.: 15/224,760

(22) Filed: Aug. 1, 2016

(65) Prior Publication Data

US 2017/0191156 A1  Jul. 6, 2017

(30) Foreign Application Priority Data

Jan. 5, 2016  (CN) .......................... 2016 1 0007049

(51) Int. Cl.
*C23C 14/52* (2006.01)
*C23C 14/54* (2006.01)
(Continued)

(52) U.S. Cl.
CPC ............ *C23C 14/546* (2013.01); *C23C 14/24* (2013.01); *H01L 41/04* (2013.01); *C23C 14/542* (2013.01);
(Continued)

(58) Field of Classification Search
CPC ........ C23C 14/546; C23C 14/542–547; G01B 11/0683; G01B 17/025
(Continued)

(56) References Cited

U.S. PATENT DOCUMENTS 3,383,238 A * 5/1968 Unzicker .............. C23C 14/546
118/664
3,699,916 A * 10/1972 Sheahan ............... C23C 14/546
118/665

(Continued)

FOREIGN PATENT DOCUMENTS

CN  103668081 A  3/2014
JP  S58174804 A  10/1983
(Continued)

OTHER PUBLICATIONS

Second Office Action, including Search Report, for Chinese Patent Application No. 201610007049.9, dated May 25, 2018, 12 pages.
(Continued)

*Primary Examiner* — Aiden Lee
(74) *Attorney, Agent, or Firm* — Westman, Champlin & Koehler, P.A.

(57) ABSTRACT

Embodiments of the present invention disclose a detection device for detecting a thickness of a vacuum-evaporated film and a vacuum evaporation apparatus, thereby solving, for example, a problem that a conventional detection device results in excessively high production cost due to frequent replacement of a crystal plate. The detection device includes: a crystal plate, a detection structure provided with an opening corresponding to the crystal plate such that evaporated molecules or atoms are deposited on the crystal plate through the opening; and a filter disposed between the opening and the crystal plate.

13 Claims, 3 Drawing Sheets

(51) Int. Cl.
  *C23C 14/24* (2006.01)
  *H01L 41/04* (2006.01)
  *G01B 17/02* (2006.01)
  *G01B 11/06* (2006.01)

(52) U.S. Cl.
  CPC ........ *C23C 14/545* (2013.01); *G01B 11/0683* (2013.01); *G01B 17/025* (2013.01)

(58) Field of Classification Search
  USPC .......................................................... 73/649
  See application file for complete search history.

(56) References Cited

U.S. PATENT DOCUMENTS

| | | | | |
|---|---|---|---|---|
| 4,362,125 | A * | 12/1982 | Schadler | G01B 17/025 118/664 |
| 5,025,664 | A * | 6/1991 | Kendrick | G01B 7/066 118/712 |
| 2002/0187253 | A1 * | 12/2002 | Marcus | C23C 14/12 427/8 |
| 2004/0206182 | A1 * | 10/2004 | Grimshaw | G01B 7/066 73/649 |
| 2005/0092239 | A1 * | 5/2005 | Grimshaw | C23C 14/546 118/712 |
| 2007/0100580 | A1 * | 5/2007 | Marcus | G01B 11/0683 702/170 |
| 2010/0055348 | A1 * | 3/2010 | Takeyama | C23C 14/32 427/576 |
| 2010/0266747 | A1 * | 10/2010 | Strickland | C23C 14/546 427/8 |
| 2013/0171349 | A1 * | 7/2013 | Takahashi | C23C 16/52 427/255.23 |
| 2016/0216143 | A1 * | 7/2016 | Choi | G01F 1/662 |

FOREIGN PATENT DOCUMENTS

| | | |
|---|---|---|
| JP | H04168311 A | 6/1992 |
| JP | H04204201 A | 7/1992 |

OTHER PUBLICATIONS

First Office Action from Chinese Patent Application No. 201610007049.9, dated Sep. 14, 2017, 11 pages.

* cited by examiner

DETECTION DEVICE FOR DETECTING THICKNESS OF VACUUM-EVAPORATED FILM AND VACUUM EVAPORATION APPARATUS

CROSS-REFERENCE TO RELATED APPLICATION

This application claims the benefit of Chinese Patent Application No. 201610007049.9 filed on Jan. 5, 2016 in the State Intellectual Property Office of China, the whole disclosure of which is incorporated herein by reference.

BACKGROUND

1. Field of the Invention

Embodiments of the present invention relate to the field of vacuum evaporation, and particularly to a detection device for detecting a thickness of a vacuum-evaporated film and a vacuum evaporation apparatus.

2. Description of the Related Art

In a vacuum evaporation system, an evaporated organic molecules or metal atoms are deposited on a crystal plate or a monitor crystal through an opening of detector. At present, generally an evaporation rate of an evaporation source is detected by means of piezoelectric effect of the crystal plate and is displayed in real time by means of a linear relation between a change of a natural frequency of the crystal plate and a thickness of a film on the crystal plate.

In order to ensure stable oscillation and high sensitivity, after the thickness of the film deposited on the crystal plate reaches a certain value, the crystal plate should be replaced with a new crystal plate.

SUMMARY

The embodiments of the present invention provide a detection device for detecting a thickness of a vacuum-evaporated film comprising: a crystal plate; a detection structure provided with an opening corresponding to the crystal plate such that evaporated molecules or atoms are deposited on the crystal plate through the opening; and a filter disposed between the opening and the crystal plate.

Embodiments of the present invention also provide a vacuum evaporation apparatus comprising the abovementioned detection device.

DETAILED DESCRIPTION OF THE EMBODIMENTS

A further description of the invention will be made in detail as below with reference to embodiments of the present invention taken in conjunction with the accompanying drawings. The following embodiments are intended to explain the present invention and the present invention should not be construed as being limited to the embodiment set forth herein.

Embodiments of the present invention provide a detection device for detecting a thickness of a vacuum-evaporated film and a vacuum evaporation apparatus, thereby solving, for example, a problem that a conventional detection device results in excessively high production cost due to frequent replacement of a crystal plate.

Figure 1A:
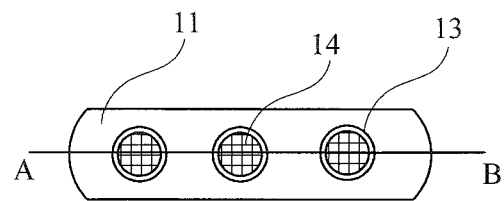
FIG. 1a is a schematic top view showing a structure of a detection device according to an embodiment of the present invention.
Figure 1B:
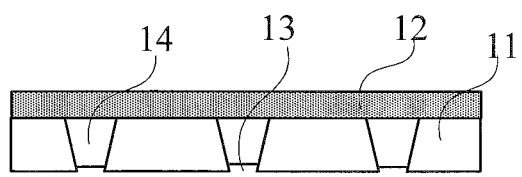
FIG. 1b is a schematic section view taken along the line A-B in FIG. 1 and showing the structure of the detection device.

Referring to FIGS. 1a and 1b, a detection device for detecting a thickness of a vacuum-evaporated film according to an embodiment of the present invention comprises: a crystal plate or a monitor crystal 12, a detection structure 11 provided with an opening 13 corresponding to the crystal plate such that evaporated molecules or atoms are deposited on the crystal plate 12 through the opening; and a filter 14 disposed between the opening and the crystal plate in order to reduce a rate of disposition of the evaporated molecules or atoms onto the crystal plate 12.

According to embodiments of the present invention, the detection structure 11 is formed with a passage, and the opening 13 is an opening of the passage on a side away from the crystal plate 12. The passage may have a shape of a frustum of cone, and a diameter of the passage on a side facing the crystal plate is greater than a diameter of the passage on the side away from the crystal plate. The passage may also have a circular cylindrical shape. The filter 14 is placed in the passage. The crystal plate 12 is superposed on the detection structure 11. The filter 14 is separated from the crystal plate 12. In the detection device for detecting a thickness of a vacuum-evaporated film according to the embodiment of the present invention, the filter is disposed between the opening of the detection structure and the crystal plate. The number of evaporated molecules or atoms deposited on the crystal plate and mass of the film deposited on the crystal plate per unit time are decreased by means of the filter, thereby decreasing a rate at which a vibration frequency of the crystal plate decreases, increasing service life of the crystal plate, and reducing cost of an evaporation process.

Figure 2:
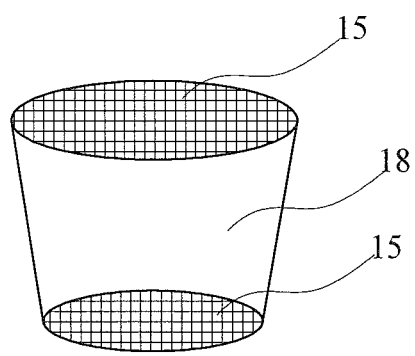
FIG. 2 is a schematic perspective view showing a structure of a filter according to an embodiment of the present invention.

In some embodiments, referring to FIG. 2, the filter 14 comprises a filter screen 15, for example two filter screens (two layers of filter screens) 15. The filter screen 15 may be parallel to the crystal plate. When the filter 14 comprises two filter screens 15, some of evaporated molecules or atoms are prevented from being deposited on the crystal plate by means of the filter screen and thus mass of the film deposited on the crystal plate 12 per unit time are decreased, thereby decreasing a rate at which a fundamental frequency of the crystal plate decreases, and increasing service life of the crystal plate. Further, in this embodiment, when the filter 14 comprises two filter screens 15, there will be neither a situation in which the filter cannot function to decrease mass of the film deposited on the crystal plate per unit time because the number of the filter screens is too small, nor a situation in which the mass of the film deposited on the crystal plate is so little that detection accuracy decreases because the number of the filter screens is too great. In addition, the number of the filter screens (the number of layers of filter screens) may be 1, 3, 4 or more. The number of the filter screens is specifically set according to actual requirements of an evaporation process.

Figure 3:
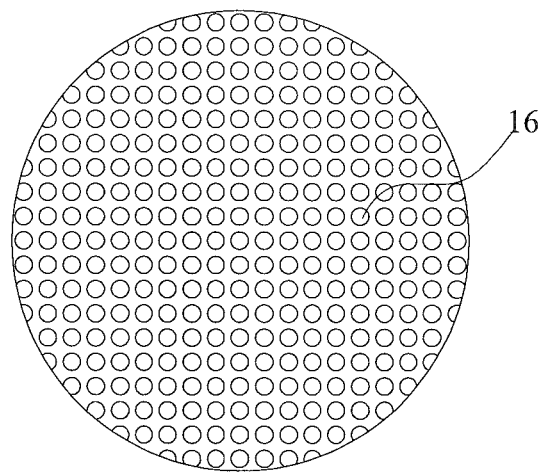
FIG. 3 is a schematic top view showing a structure of a filter screen according to an embodiment of the present invention.

In some embodiments, referring to FIG. 3, each of the filter screens 15 comprises a plurality of meshes 16 arranged regularly or in a regular manner.

The regular arrangement of the meshes 16 of the filter screen facilitates more uniform diffusion of the evaporated molecules or atoms onto the crystal plate, and improvement of a linear relation between the frequency of the crystal plate and the mass of the film deposited on the crystal plate and accuracy of detection of the thickness of the film. In addition, the meshes of the filter screen 15 may have a circular shape, a square shape, a rectangular shape, a triangular shape or any other shape.

In some embodiments, a bore diameter of the meshes 16 may be in a range of 0.5 mm~1 mm.

In this embodiment, when the bore diameter of the meshes is in the range of 0.5-1 mm, a problem that the filter cannot function to decrease mass of the film deposited on the crystal plate per unit time because of an excessively large bore diameter can be prevented, and a problem that the mass of the film deposited on the crystal plate is so little that detection accuracy decreases because of an excessively small bore diameter can also be prevented.

In some embodiments, the filter screen 15 may be made of metal material.

The metal material has advantages such as a high hardness and uneasiness to deform, thereby facilitating more uniform diffusion of the evaporated molecules or atoms onto the crystal plate, and improving the linear relation between the frequency of the crystal plate and the deposited mass and the accuracy of detection. In addition, when the filter screen is made of the metal material, the service life of the filter screen can be prolonged and the production cost of the evaporation process is further decreased. Furthermore, the filter screen may also be made of other material that has a high hardness and is not easy to deform, such as ceramics and toughened glass.

In some embodiments, the filter 14 may further comprise a connection part 18 for fixing a plurality of filter screens 15 such as the two filter screens 15. The filter screens 15 may be engaged with the connection part 18 or the filter screens 15 may be fixedly connected with the connection part 18 by means of screws or the like. The connection part 18 may surround the plurality of filter screens 15 and may constitute a side wall of the filter 14.

In the embodiment, referring to FIGS. 1a, 1b and 2, the opening 13 has a circular shape and the filter 14 has a shape of an inverted frustum of cone. The inverted frustum of cone has a small-diameter-side end surface close to the opening 13 of the detection structure, and a large-diameter-side end surface close to the crystal plate.

The filter has the shape of an inverted frustum of cone, and the inverted frustum of cone has the small-diameter-side end surface close to the opening of the detection structure, and the large-diameter-side end surface close to the crystal plate. Thereby the filter can be locked by the opening, so that the filter is fixed at the opening and cannot fall.

Figure 4:
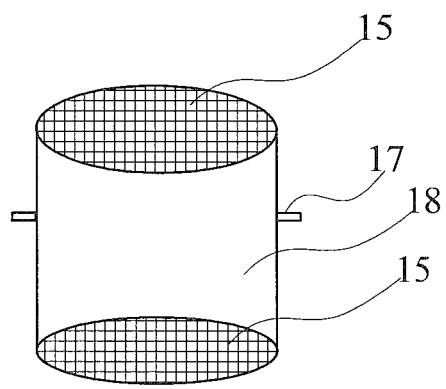
FIG. 4 is a schematic perspective view showing a structure of another filter according to an embodiment of the present invention.

In addition, referring to FIG. 4, the filter 14 may also have a circular cylindrical shape. A stop structure 17 is disposed on a side of the circular cylindrical filter 14. The filter 14 is locked at the opening by means of the stop structure 17, so that the purpose that the filter is fixed at the opening and cannot fall can also be achieved.

It is to be noted that the shape of the opening 13 and a shape of a cross section of the filter 14 should be as consistent with each other as possible. For example, if the opening 13 has a rectangular shape, the filter 14 may have a shape of an inverted frustum of rectangular pyramid, or a shape of a quadrangular prism; and if the opening 13 has a triangular shape, the filter 14 may have a shape of an inverted frustum of triangular pyramid, or a shape of a triangular prism, thereby facilitating fixation of the filter at the opening.

In this embodiment, the small-diameter-side end surface of the inverted frustum of cone has a diameter that is less than or equal to a bore diameter of the opening 13, and the large-diameter-side end surface of the inverted frustum of cone has a greater diameter than the bore diameter of the opening 13.

When the small-diameter-side end surface of the inverted frustum of cone has the diameter that is less than or equal to the bore diameter of the opening, and the large-diameter-side end surface of the inverted frustum of cone has the greater diameter than the bore diameter of the opening, the filter can be locked at the opening, thereby facilitating replacement and placement of the filter.

In some embodiments, the large-diameter-side end surface of the inverted frustum of cone has an area that is not greater than an area of the crystal plate 12.

When the large-diameter-side end surface of the inverted frustum of cone has the area that is not greater than the area of the crystal plate 12, as many evaporated molecules or atoms as possible are deposited on the crystal plate, and a problem that detection accuracy decreases because the mass of the film deposited on the crystal plate is too little is prevented.

Figure 5:
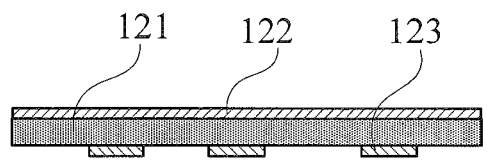
FIG. 5 is a schematic section view showing a structure of a crystal plate.

In some embodiments, referring to FIG. 5, the crystal plate 12 comprises a crystal plate body 121, and a first electrode 122 and a second electrode 123 respectively located on both sides of the crystal plate body 121. The first electrode 122 located on one side of the crystal plate body 121 facing the opening 13 covers the crystal plate body 121, and the second electrode 123 located on the other side of the crystal plate body 121 away from the opening 13 has a shape of a key hole.

When a voltage is applied to the crystal plate through the first electrode 122 and the second electrode 123, the crystal plate will vibrate. A vibration frequency of the crystal plate will gradually decrease with increasing of a thickness of the film deposited on the crystal plate. A density of a deposited film formed by a determined material for vacuum evaporation is a constant. When the film is not too thick, i.e., the mass of the deposited film is much less than the mass of the crystal plate itself, a natural frequency of the crystal plate will not change much. Therefore, it can be considered that a relation between a change of the frequency of the crystal plate and the thickness of the deposited film is approximately linear. Therefore, the thickness of the deposited film can be detected by detecting the change of the frequency of the crystal plate.

It is to be noted that in the embodiments of the present invention, since the filter is disposed between the opening of the detection structure and the crystal plate, the thickness of the deposited film formed on a substrate to be subjected to a vacuum evaporation process during vacuum evaporation is different from the thickness of the deposited film formed on the crystal plate, but is proportional to the thickness of the deposited film formed on the crystal plate. Therefore, when the thickness of the film on the substrate is detected by the detection device, the thickness of the deposited film on the crystal plate should firstly be detected by means of the change of the frequency of the crystal plate, and then the thickness of the film on the substrate is calculated according to the proportional relation.

Figure 6:
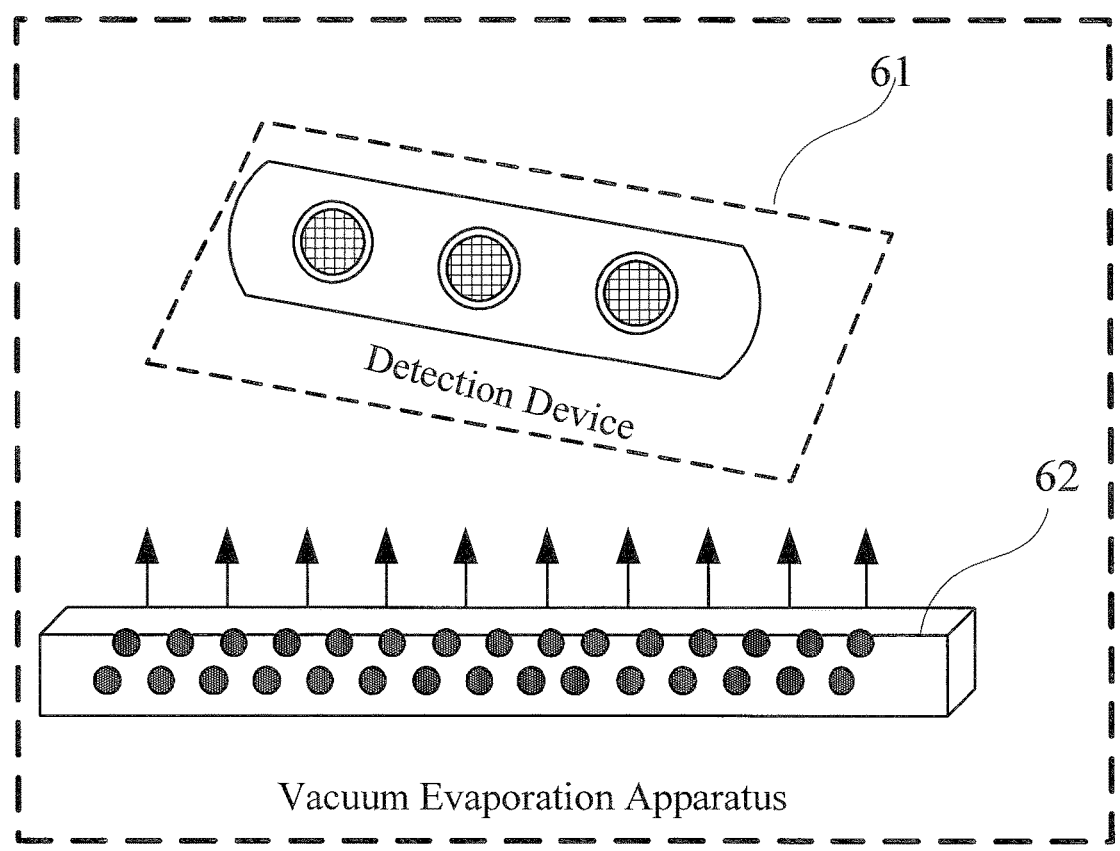
FIG. 6 is a schematic diagram showing a functional structure of an evaporation apparatus according to an embodiment of the present invention.

Based on the same inventive concept, embodiments of the present invention also provide a vacuum evaporation apparatus, referring to FIG. 6. The vacuum evaporation apparatus comprises: the detection device 61 for detecting a thickness of a vacuum-evaporated film according to the embodiment of the present invention, and an evaporation source 62 for supplying evaporated molecules or atoms. The detection device 61 comprises: a crystal plate 12, a detection structure 11 provided with an opening 13 corresponding to the crystal plate such that evaporated molecules or atoms are deposited on the crystal plate 12 through the opening; and a filter 14 disposed between the opening and the crystal plate in order to reduce a rate of disposition of the evaporated molecules or atoms onto the crystal plate 12. In addition, the opening 13 is located on a side of the detection structure 11 facing the evaporation source 62.

During evaporation, some of evaporated molecules or atoms obtained by a method such as thermal evaporation and atom bombardment are deposited to form a film on a substrate to be subjected to a vacuum evaporation process, while some of the evaporated molecules or atoms pass through the filter 14 and form a deposited film on the crystal plate. Therefore, the thickness of the film on the substrate can be calculated by detecting the thickness of the deposited film on the crystal plate and by means of the proportional relation between the thickness of the deposited film formed on the substrate and the thickness of the deposited film formed on the crystal plate.

As described above, the embodiments of the present invention provide a detection device for detecting a thickness of a vacuum-evaporated film and a vacuum evaporation apparatus. In the detection device, the filter is disposed between the opening of the detection structure and the crystal plate. The number of evaporated molecules or atoms deposited on the crystal plate and mass of the film deposited on the crystal plate per unit time are decreased by means of the filter, thereby decreasing a rate at which a vibration frequency of the crystal plate decreases, increasing service life of the crystal plate, and reducing cost of an evaporation process. Furthermore, after having passed through the filter, the evaporated molecules or atoms are deposited on the crystal plate more uniformly, thereby facilitating improvement of the linear relation between the frequency of the crystal plate and the thickness of the deposited film and thus the accuracy of detection of the film.

The above embodiments are only used to explain the present invention, and should not be construed to limit the present invention. It will be understood by those skilled in the art that various changes and modifications may be made therein without departing from the spirit of the present invention, the scope of which is defined in the appended claims and their equivalents.

What is claimed is:

1. A detection device for detecting a thickness of a vacuum-evaporated film comprising:
    a crystal plate;
    a detection structure formed with a plurality of passages, wherein each of the plurality of passages has a first opening and a second opening opposite to each other and an inner wall surface, the inner wall surface has a straight-line shape in a section of the passage taken along an axial direction of the passage, and the crystal plate covers the first openings of the plurality of passages; and
    a filter disposed between the first opening and the second opening in the passage, such that some of molecules or atoms evaporated from an evaporation source are deposited on a substrate while some of the molecules or atoms evaporated from the evaporation source are deposited on the crystal plate from the second opening of the passage through the filter,
        wherein the filter is an integrated filter formed by: a plurality of filter screens each comprising a plurality of meshes arranged regularly, and a connection part connecting the plurality of filter screens;
        wherein the connection part surrounds the plurality of filter screens and constitutes a side wall of the filter such that a cavity is formed by the connection part and two adjacent ones of the plurality of filter screens;
        wherein the side wall of the filter has a straight-line shape in a section taken along the axial direction of the passage; and
        wherein the passage has a cross section having a circular shape, the filter has a shape of an inverted frustum of cone, and the inverted frustum of cone has a small-diameter-side end surface close to the second opening of the passage and a large-diameter-side end surface close to the first opening of the passage.

2. The detection device of claim 1, wherein:
the filter screen is parallel to the crystal plate.

3. The detection device of claim 1, wherein:
the filter comprises two filter screens.

4. The detection device of claim 3, wherein:
the two filter screens are parallel to the crystal plate.

5. The detection device of claim 1, wherein:
bore diameters of the meshes are in a range of 0.5-1 mm.

6. The detection device of claim 1, wherein:
the filter screen is made of metal material.

7. The detection device of claim 1, wherein:
the small-diameter-side end surface of the inverted frustum of cone has a diameter that is less than or equal to a bore diameter of the second opening, and the large-diameter-side end surface of the inverted frustum of cone has a greater diameter than the bore diameter of the second opening.

8. The detection device of claim 1, wherein:
the large-diameter-side end surface of the inverted frustum of cone has an area that is not greater than an area of the crystal plate.

9. The detection device of claim 1, wherein:
the filter has a circular cylindrical shape, and a stop structure for locking the filter in the passage in disposed on a side of the filter.

10. The detection device of claim 1, wherein:
the passage has a shape of a frustum of cone, and a diameter of the passage on a side facing the crystal plate is greater than a diameter of the passage on the side away from the crystal plate.

11. The detection device of claim 1, wherein:
the passage has a circular cylindrical shape.

12. The detection device of claim 1, wherein:
the crystal plate is superposed on the detection structure.

13. A vacuum evaporation apparatus comprising:
the detection device according to claim 1.

* * * * *